(12) United States Patent
Dove

(10) Patent No.: US 8,216,904 B2
(45) Date of Patent: Jul. 10, 2012

(54) STRAINED TRANSISTOR AND METHOD FOR FORMING THE SAME

(75) Inventor: Barry Dove, Coppell, TX (US)

(73) Assignee: ST Microelectronics, Inc., Carrollton, TX (US)

( * ) Notice: Subject to any disclaimer, the term of this patent is extended or adjusted under 35 U.S.C. 154(b) by 148 days.

(21) Appl. No.: 12/651,217

(22) Filed: Dec. 31, 2009

(65) Prior Publication Data

US 2010/0164000 A1 Jul. 1, 2010

Related U.S. Application Data

(60) Provisional application No. 61/142,066, filed on Dec. 31, 2008, provisional application No. 61/168,484, filed on Apr. 10, 2009.

(51) Int. Cl.
*H01L 21/762* (2006.01)
*H01L 27/088* (2006.01)

(52) U.S. Cl. ............ 438/296; 257/E21.049; 257/E27.06

(58) Field of Classification Search .......................... None
See application file for complete search history.

(56) References Cited

U.S. PATENT DOCUMENTS

| | | | | |
|---|---|---|---|---|
| 5,702,976 | A * | 12/1997 | Schuegraf et al. | 438/424 |
| 6,133,105 | A * | 10/2000 | Chen et al. | 438/296 |
| 6,265,282 | B1 * | 7/2001 | Lane et al. | 438/424 |
| 6,710,413 | B2 * | 3/2004 | Thei et al. | 257/382 |
| 7,112,495 | B2 * | 9/2006 | Ko et al. | 438/300 |
| 7,166,531 | B1 * | 1/2007 | van den Hoek et al. | 438/623 |
| 7,190,036 | B2 * | 3/2007 | Ko et al. | 257/374 |
| 7,221,024 | B1 | 5/2007 | Chidambarrao et al. | |
| 7,365,357 | B2 | 4/2008 | Atanackovic et al. | |
| 7,423,330 | B2 * | 9/2008 | Satoh | 257/649 |
| 7,767,515 | B2 * | 8/2010 | Moroz et al. | 438/221 |
| 7,816,766 | B2 * | 10/2010 | Tamura et al. | 257/616 |
| 7,821,074 | B2 * | 10/2010 | Yokoyama | 257/369 |
| 7,939,413 | B2 * | 5/2011 | Chong et al. | 438/300 |

(Continued)

OTHER PUBLICATIONS

Yang, Ruipeng, Na Su, Paolo Bonfanti, Jiaxiang Nie, Jay Ning, and Tomi T. Li. "Advanced in Situ Pre-Ni Silicide (Siconi) Cleaning at 65 nm to Resolve Defects in NiSi[sub X] Modules." Journal of Vacuum Science & Technology B: Microelectronics and Nanometer Structures 28.1 (2010).*

(Continued)

*Primary Examiner* — Thomas L Dickey
*Assistant Examiner* — Joseph Schoenholtz
(74) *Attorney, Agent, or Firm* — Seed IP Law Group PLLC

(57) ABSTRACT

According to one embodiment, a semiconductor substrate is provided having at least two transistor regions formed therein. Overlying the channel regions is a gate dielectric and transistor gate electrodes overly the gate dielectric and are positioned overlying the channel regions. Source and drain regions are formed on either side of the channel regions to create a transistor structure. In order to provide isolation between transistors in the semiconductor substrate, a trench is formed in the substrate. A strain-inducting layer is then deposited over the transistor structures and into the trench in the semiconductor substrate. A high-stress nitride layer is one type of material which is suitable for forming the strain-inducing layer.

13 Claims, 8 Drawing Sheets

U.S. PATENT DOCUMENTS

| | | | |
|---|---|---|---|
| 7,989,912 B2 * | 8/2011 | Yl ................................. | 257/510 |
| 8,026,571 B2 * | 9/2011 | Lu et al. ........................ | 257/506 |
| 2005/0158937 A1 * | 7/2005 | Yang et al. .................... | 438/199 |
| 2005/0263825 A1 | 12/2005 | Frohberg et al. | |
| 2007/0290293 A1 * | 12/2007 | Trivedi et al. ................ | 257/506 |
| 2008/0122000 A1 * | 5/2008 | Lindsay ........................ | 257/368 |
| 2008/0194070 A1 * | 8/2008 | Shih et al. ..................... | 438/285 |
| 2008/0293194 A1 * | 11/2008 | Chen et al. .................... | 438/199 |
| 2008/0303102 A1 * | 12/2008 | Liang et al. ................... | 257/397 |

OTHER PUBLICATIONS

Ito, Shinya. "Effect of Mechanical Stress Induced by Edtch-stop Nitride: Impact on Deep-sibmicron Transistor Performance." Microelectronics Reliability 42 (2002): 201-09.*

Zaouia, S. "Investigation of Compressive Strain Effects Induced by STI and ESL." Nanoscaled Semiconductor on Insulation Structures and Devices (2007): 239-50.*

* cited by examiner

FIG. 1 *(Prior Art)*

STRAINED TRANSISTOR AND METHOD FOR FORMING THE SAME

RELATED APPLICATION

This application claims the benefit of U.S. Provisional Application No. 61/142,066 filed on Dec. 31, 2008, entitled Method and Structure for Forming Strained Transistor and 61/168,484 entitled Method and Structure for Forming Strained Transistor, filed Apr. 10, 2009, both of which applications are incorporated herein by reference.

TECHNICAL FIELD

This invention relates to a method and structure for forming strained transistors and, in particular, a strain-inducing layer which overlays the transistors and is also within a trench in the semiconductor substrate for creating a strained transistor structure.

BACKGROUND

It is known in the art that a transistor subjected to different types of stress increases the mobility of the charge carriers in the channel region. For example, creating a tensile stress in the channel region increases the mobility of electrons and, depending on the magnitude of the stress, increases in mobility of up to 20% may be obtained. This, in turn, directly translates into an increase in conductivity and faster speed. Similarly, compressive stress in the channel region may increase the mobility of holes, thereby providing enhanced performance of those transistors which conduct based on the mobility of holes.

Consequently, it has been proposed to introduce a compressive stress into the channel region of P-type transistors and a tensile stress into the channel region of N-type transistors. A number of structures have been proposed in the prior art to induce stress in these respective channel regions.

FIG. 1 illustrates a structure commonly used in the prior art for inducing stress in the channel regions of transistors. This structure includes a plurality of transistors 1 having a shallow trench isolation region 2 formed therebetween. Each of the transistors includes a respective gate dielectric 3 and a gate electrode 4. Positioned underneath the gate electrode 4 is a channel region 5. Adjacent the channel region 5 is a source/drain region 6 that is positioned in the substrate between the trench isolation region 2 and the channel region 5. Sidewall spacers 7 and a silicide layer 8 are also formed as is known in the art.

A dielectric layer 9, which is compressively stressed, is then deposited overlying the semiconductor integrated circuit structure, including the transistors 1, the source/drain regions 6, and the trench isolation region 2. For an N-type transistor, the dielectric layer 9 is a silicon nitride layer having a specified compressive stress. The dielectric layer 9 can be deposited having the desired magnitude of compressive stress or tensile stress as is known in the art in order to achieve the stress characteristics needed within the dielectric layer 9.

A structure of the type shown in FIG. 1 is described and shown in detail in U.S. Patent Application Publication No. 2005/0263825 to Fulmberg et al., (the '825 application) which is incorporated herein by reference.

While the structure of FIG. 1 illustrates an attempt for inducing stress into the channel of the transistor, it has the shortcoming that the stress is only indirectly applied to the channel region and is difficult to precisely apply to the channel region.

Another technique for forming a strained channel region is shown in U.S. Pat. No. 7,221,024, but this involves a number of difficult process steps and many additional masks.

BRIEF SUMMARY

According to one embodiment, a plurality of transistors are formed in a semiconductor substrate. The transistors include a channel region and source/drain regions within the substrate. A gate electrode overlies the channel region of each transistor and is separated from the channel region by a dielectric layer. A trench isolation region is positioned between those transistors that are adjacent to each other in the substrate but whose source/drain regions must be electrically isolated for proper circuit operation. Accordingly, the trench isolation regions prevent parasitic effects, such as noise and cross talk between the electrical signals and the respective transistors on either side thereof.

A dielectric layer having selected strain-inducing properties is deposited overlying the transistors and on sidewalls and a bottom of the trench isolation region between adjacent transistors. In particular, the strain-inducing layer overlies the gate electrodes, sidewall spacers, and source/drain regions of the transistors, and also continues along the sidewalls and the bottom of the trench isolation region to have a portion substantially parallel to and horizontal with respect to a surface of the substrate in which the channel region is formed. In one embodiment, the strain-inducing layer is a silicon nitride which induces compressive stress on the channel regions of the transistors. In alternative embodiments, a silicon dioxide may be deposited to induce tensile stress in the channel regions of the transistors.

In one embodiment, a single layer is deposited over the transistors and also within the trench isolation region in the substrate. In alternative embodiments, the strain-inducing layer is a laminate layer containing multiple separately deposited layers of the same or different materials having different stress properties therein in order to provide a selected target stress on the channel regions of the respective transistors. After the strain-inducing layer is deposited over the transistors and into the trench isolation region, a dielectric layer fills the remainder of the trench isolation region and covers the transistors. Preferably, the dielectric is a low-k dielectric layer. One particular advantage provided is that a greater surface area is provided for exerting stress on the substrate for creating strained transistor structures which operate with improved characteristics. A further advantage is that a low-k dielectric material may be formed in the trench isolation regions therefore providing improved insulation between adjacent structures and permitting smaller trench isolation regions to be used. This will also reduce capacitive coupling and provide additional advantages with greater use of the low-k dielectric material. The structure also minimizes stress risers in the corners of the trench isolation region, reducing defects in the monocrystalline semiconductor substrate.

A further advantage is that a nitride layer, as well as other strain-inducing layers, provide a stronger barrier to the diffusion of dopants in HTD source/drain regions and the silicide regions adjacent the trench isolation regions. This will further allow the trench isolation regions to be made narrower, thus conserving silicon space on the substrate.

DETAILED DESCRIPTION

Figure 2:
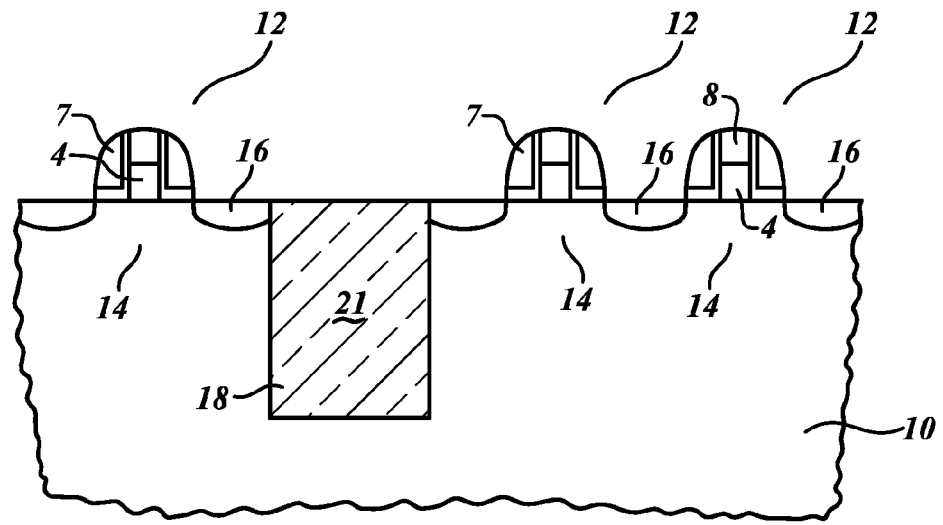
FIG. 2 is a partial cross-sectional view of a semiconductor substrate according to one embodiment of the present invention.

FIG. 2 illustrates a semiconductor substrate 10, preferably made of monocrystalline silicon. The substrate has a plurality of transistors 12 formed therein. The transistors include channel regions 14 and source drain/regions 16. The term source/drain region includes both the source and the drain of a MOS transistor. As is known, a heavily doped conductive region adjacent a gate electrode can be either a source or a drain, depending on the relative electrical potentials at the gate electrode. Thus, the general term source/drain region as used herein includes all such regions, whether acting as sources or drains. The transistors 12 may have LDD implants, halo regions, and other structures, as are well-known in the art.

A trench isolation region 18 electrically isolates at least two of the transistors from each other. In one embodiment, the trench isolation region 18 is filled with a dielectric material 21, which has been previously deposited according to known techniques for forming shallow trench isolation regions 18. The forming of trench isolation regions 18 is well known in the art and need not be described here.

According to one embodiment, the substrate is patterned and etched to form trenches as recesses at selected locations in the substrate. Subsequently, a thin pad oxide is grown in the trenches on top of which a thick silicon dioxide layer is deposited for the isolation material 21 to form the completed trench isolation region 18.

Figure 3:
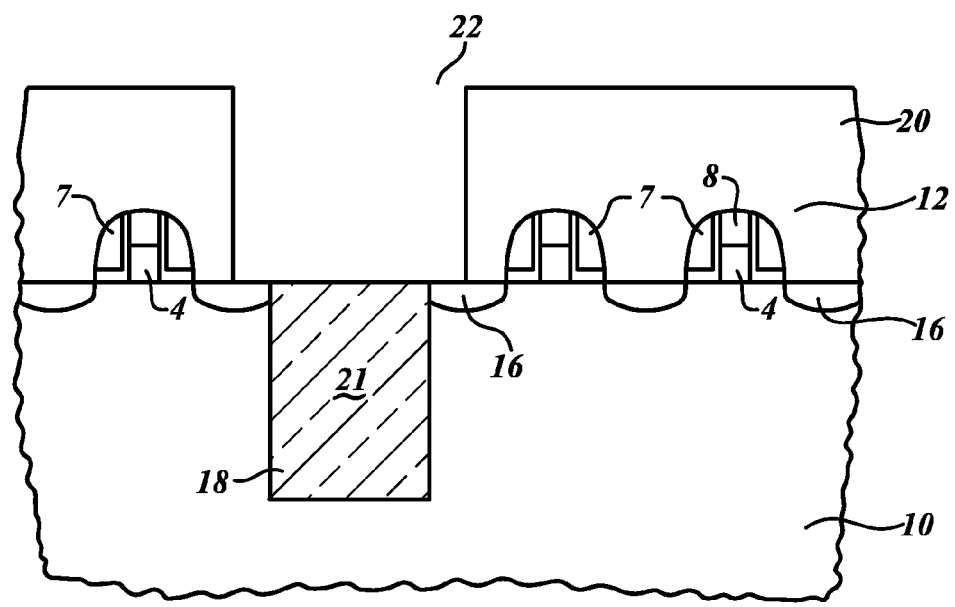
FIG. 3 is a cross-sectional view of a further step in the process of FIG. 2.

As shown in FIG. 3, a photoresist layer 20 is then deposited over the transistors 12 and an opening 22 is formed therein by known techniques using a mask exposure and development of the photoresist.

Figure 4:
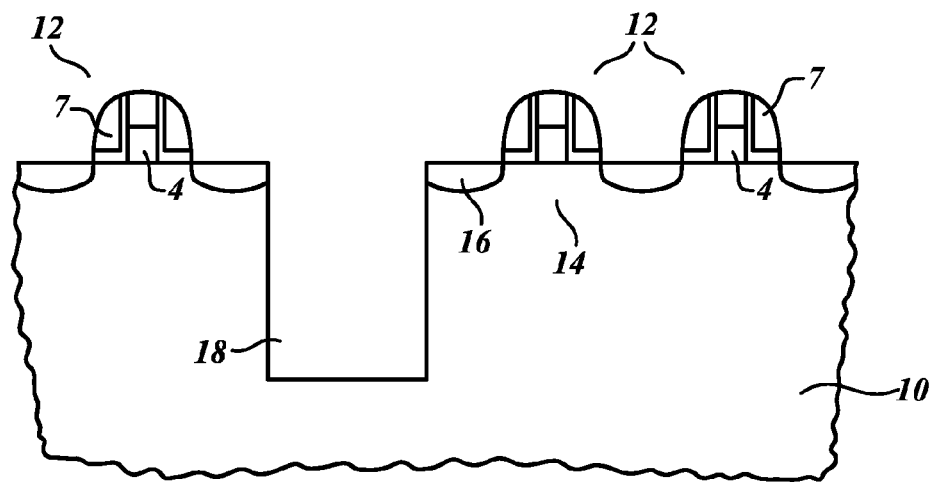
FIG. 4 illustrates an additional step in the process of FIG. 2.

As shown in FIG. 4, the dielectric material 21 inside the shallow trench 18 is then removed with an appropriate etch. If the dielectric material 21 inside the trench 18 is a silicon dioxide then an etch which is highly selective to silicon dioxide over silicon is preferably used. This permits the photoresist 20 to have a high degree of tolerance for alignment with the location of the trench 18. As shown in FIG. 3, the opening 22 is somewhat larger than the shallow trench isolation region 18. Since the etch is selective to silicon dioxide, or any other material inside the trench 18, the opening 22 can be made somewhat larger to ensure that even with slight misalignment errors or with large tolerances allowed in the mask for the photoresist 20, the silicon dioxide will be properly etched and the adjacent transistor structures 12 in the monocrystalline silicon substrate 10 will not be etched.

Figure 1:
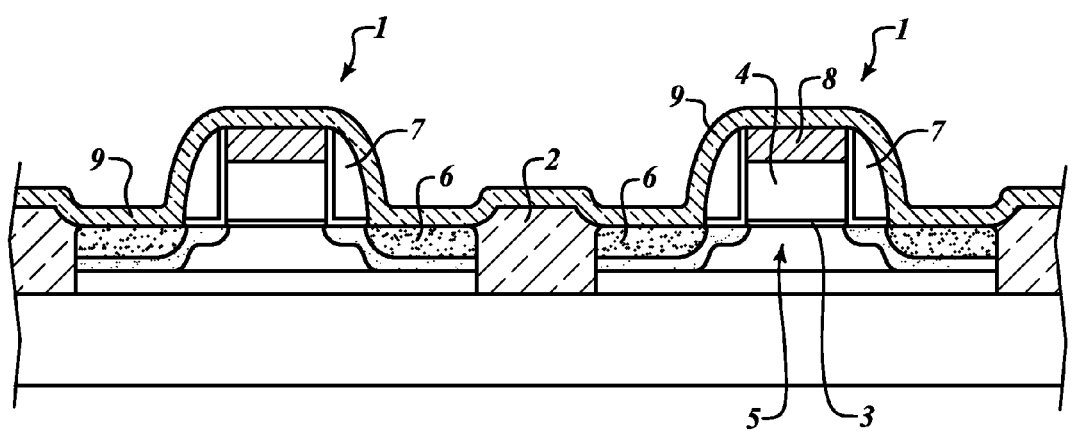
FIG. 1 is a cross-sectional view of a strained transistor structure according to the prior art.
Figure 5:
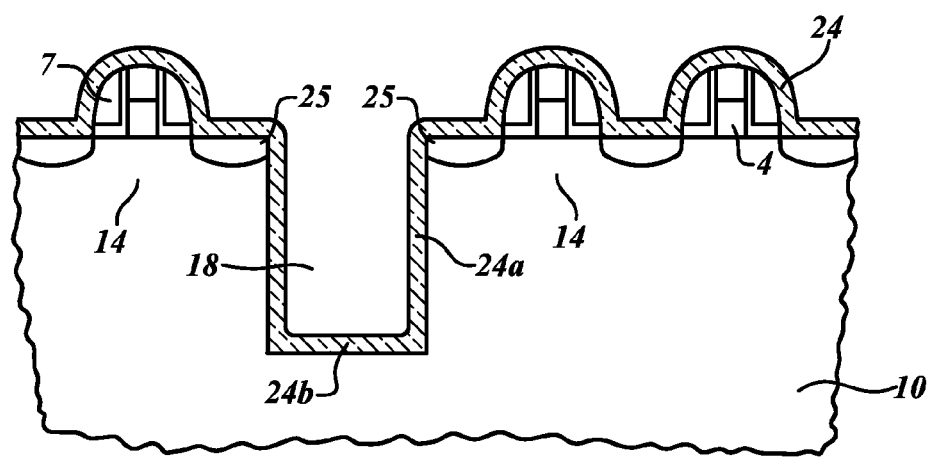
FIG. 5 illustrates an additional step in the process of FIG. 2.

After the dielectric layer 21 is removed from the trench as shown in FIG. 4, a strain-inducing layer 24 is conformally deposited over the entire semiconductor substrate 10 and into the open trench 18. The strain-inducing layer 24 is deposited as a conformal layer having a generally uniform thickness and thus adheres to the transistors, as well as the sidewalls and bottom of trench 18. The strain-inducing layer 24 includes a generally vertical sidewall portion 24a on the sidewalls of the trench and a generally flat, horizontal portion 24b, in one embodiment. The deposition into the shallow trench isolation region 18 exerts stress on the substrate for creating an improved strained transistor structure. The strain-inducing layer 24 also reduces stress risers in corners of the trench isolation region 18 which may occur at locations 25 as shown in FIG. 5. Stress risers are known to have occurred in the previous shallow trench structures in the prior art, such as that shown in FIG. 1. By depositing at least a portion of the strain-inducing layer 24 into the trench 18, the stress risers are reduced or eliminated completely.

In one embodiment, the strain-inducing layer 24 is silicon nitride. In other embodiments, the strain-inducing layer 24 includes a silicon dioxide, a silicon oxynitride, or other conformally deposited dielectric layers. The formation of silicon nitride, silicon dioxide, or silicon oxynitride as conformal strain-inducing layers is carried out to achieve a desired amount of stress on the channel 14 using semiconductor processing techniques known in the art.

As described in the previously introduced '825 application and also described in U.S. Pat. No. 7,365,357, (the '357 patent) a silicon nitride or silicon dioxide layer can be deposited to exhibit compressive stress or tensile stress. In the case of silicon nitride, for example, a deposition by plasma enhanced chemical vapor deposition (PECVD) in which a bias power supply to the plasma atmosphere is used, the amount of power may be varied to adjust the mechanical stress creating the silicon nitride layer as it is deposited. For example, a deposition may be performed using well-established process recipes to create a compressive stress in silicon nitride of approximately 150 MPa with a moderately high bias power. Additionally, using other well-established deposition recipes, silicon nitride can be deposited with a tensile stress of approximately 30-1,000 MPa in order to exert the tensile stress on the substrate. In general, the stress created in the silicon nitride during the deposition process depends on the gas mixture, the deposition rate, the temperature and the ion embardment. According to well-known process recipes, the corresponding amount of tensile or compressive stress in the layer may be adjusted by, for instance, varying the amount of the process parameters to create the desired tensile or compressive stress in the silicon nitride layer itself.

The thickness of the strain-inducing layer in a preferred embodiment would be in the same range of thickness typically used for a strain-inducing layer, as would be apparent to one of ordinary skill in the art (depending upon the process geometry of the device and on the amount of strain desired). In an embodiment of the present invention, the strain-inducing layer may be made up of one or more layers (e.g., laminates or composite). For example, the strain-inducing layer may be made from a series of nitride layers in laminate. Furthermore, the strain-inducing layer 24 may include one or more layers of one or more materials. In addition, as disclosed in the '825 application, the strain-inducing layer 24 can be modified to provide a compressive stress at one location and a tensile stress at other locations by appropriate doping and heat treatments. Thus, the same strain-inducing layer 24 can be deposited over both p-type and n-type transistors and then doped or annealed to change the type and amount of strain over different types of transistors.

According to one embodiment, a thickness in the range of 50-100 nm is used, with some variation depending on the number of layers in the laminate. In another embodiment, the thickness is preferable in the range of 10-15 nm and is limited to be less than 20 nm. This thinner strain-inducing layer 24 is used when a shallow channel and shallow source/drain regions are present, as are common in some technologies having very shallow source/drain implants.

The '357 patent includes a table which describes different processes that may be used for the deposition of various films that exhibit compressive or tensile stress. The '357 patent discloses three different deposition processes for depositing silicon dioxide to exhibit either compressive or tensile stress, and also discloses three different deposition processes for depositing silicon nitride that exhibits either tensile or compressive stress.

The type of stress, whether tensile or compressive, and the amount of stress formed in the stress-inducing layer 24 is selected to place a desired type and amount of stress on the channel region 14. Of course, not all of the stress in the layer 24 will be exerted directly on the channel region 14. In addition, the stress exerted by the portion of the stress-inducing layer 24 directly over the gate electrode will have a different effect than the stress induced by the portion of the layer 24 on the sidewalls on the trench 18. Accordingly, the amount of stress in the strain-inducing layer 24 will be selected to achieve a desired target stress in the channel region 14 and source/drain regions 16 based on the overall shape and location of the strain-inducing layer 24.

The strain-inducing layer 24 may also be a combination of one or more layers. For example, in one embodiment a pad oxide is grown in the trench 18 prior to the deposition of a silicon nitride strain-inducing layer 24. The growth of the pad oxide provides better adhesion between the silicon nitride strain-inducing layer 24 and the sidewalls of the trench 18. In other embodiments, the strain-inducing layer is silicon dioxide itself and therefore a pad oxide need not be grown. In yet other embodiments, the strain-inducing layer 24 is a combination of two or three different sublayers including combinations of silicon nitride and silicon dioxide in order to achieve a desired final strain in the channel region 14.

Figure 6:
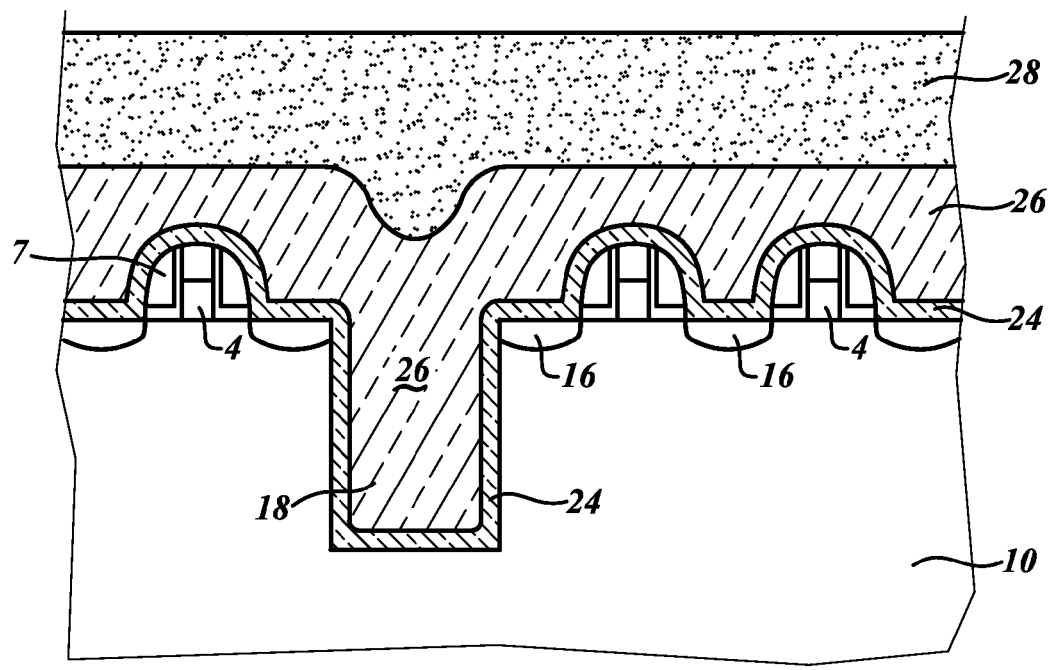
FIG. 6 illustrates an additional step in the process of FIG. 2.

After the strain-inducing layer 24 has been deposited, an additional dielectric layer 26 is deposited over the transistors and into the trench area 18, as illustrated in FIG. 6. Preferably, this is a low-k dielectric material which is formed both over the transistors and in the trench isolation region. Use of the low-k dielectric material provides improved insulation as compared to the silicon dioxide which is traditionally used to fill trenches in a shallow trench isolation structure. The low-k dielectric may be an aerogel or some other nanoporous structure. In some embodiments, the dielectric layer 26 is planarized with a CMP and/or etch, while in other embodiments the dielectric layer 26 is generally conformal on the bottom region thereof and another low-k dielectric layer 28, such as one containing carbon, is deposited as a planarizing layer over the first low-k dielectric layer 26, which may then be planarized such as with a CMP and/or etch, as shown in FIG. 6 for example.

According to one alternative embodiment, it is also possible to carry out the present invention without first forming a silicon dioxide layer inside the trench isolation regions. According to this alternative embodiment, a shallow trench 18 is formed either before or after transistors 12 are formed on the substrate to achieve the structure as shown in FIG. 5. Rather than filling the trench 18 with silicon dioxide, the strain-inducing layer 24 is such as a nitride layer, is conformally deposited on the substrate and over the transistors in a manner similar to that shown in FIG. 5.

In one embodiment, prior to forming the silicon nitride strain-inducing layer (see FIGS. 4 and 5), it may be preferred to grow a thin native oxide layer in the format of silicon dioxide, or otherwise form a thin oxide layer, to act as an adhesion layer for the nitride layer to better adhere to the substrate. In the alternative to an oxide, this thin adhesion layer could be another material that provides a good adhesion layer between the strain-inducing layer and the substrate, depending upon the material composition of the strain-inducing layer. For the strain-inducing layer made from a silicon nitride layer, a thin, grown silicon dioxide layer is a preferred adhesion layer for the nitride layer on the silicon substrate, for example. The thickness of the adhesion layer is preferably a thickness that provides for maximum adhesion (e.g., about 5-20 angstroms).

Figure 7:
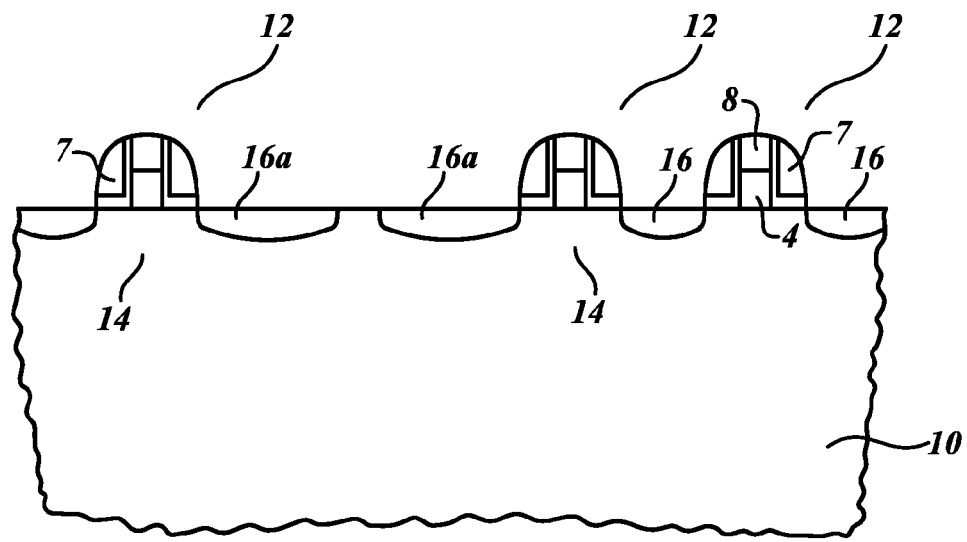
FIG. 7 is a cross-sectional view in a step of forming a strained silicon transistor according to an alternative embodiment of the present invention.
Figure 8:
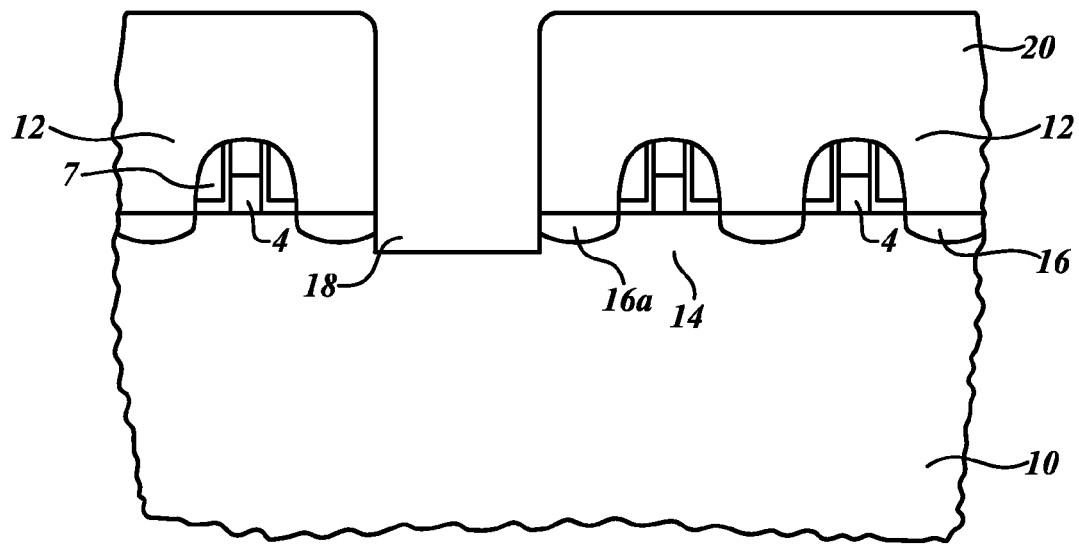
FIG. 8 is a cross-sectional view of the method of FIG. 7 at a further step in the process.
Figure 9:
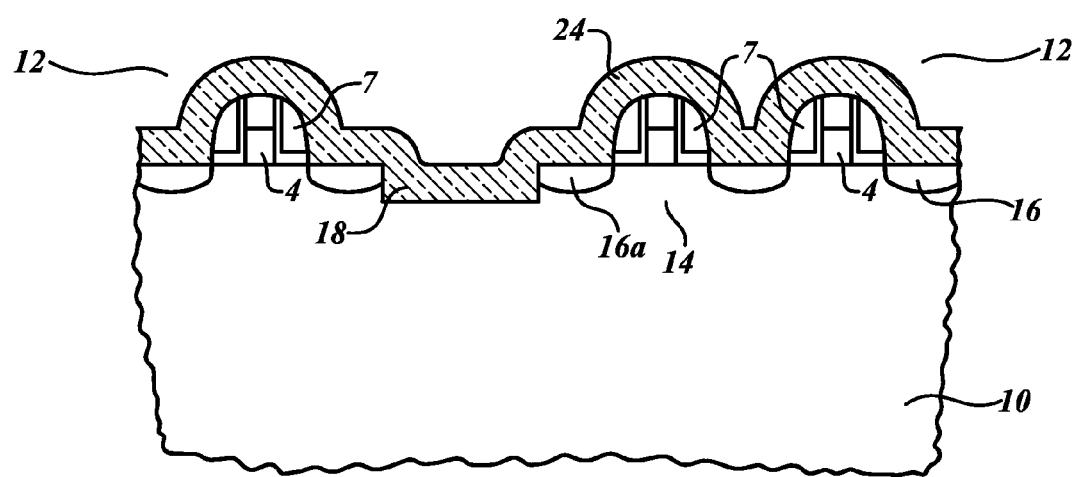
FIG. 9 is a cross-sectional view of the method of FIG. 7 at a further step in the process.

FIGS. 7, 8 and 9 are cross-sectional views of an alternative embodiment. As shown in FIG. 7, transistors 12 are completely formed including LDD implants, sidewall spacers, and source/drain regions 16. The channel regions 14 are also formed under the respective transistors. As of this step in the sequence, the trench isolation region has not been formed. Instead, the source/drain regions 16, which are positioned overlapping where the trench isolation region is to be formed, are substantially enlarged and extend for a uniform depth. In one embodiment in which all transistors 12 are of the same type, such as all N-type, the source/drain regions 16a are formed as a continuous uniform layer between the two adjacent transistors 12. The source/drain regions are formed without a mask so the dopant extends uniformly along the entire distance between the two adjacent transistors. In the alternative embodiment, shown in FIG. 7, one of the transistors 12 is a P-channel transistor and the other transistor 12 is an N-channel transistor. The same mask, which is used to mask out the dopants for the source/drain regions in forming the transistors, is also used for forming the demarkation line between the extended source/drain regions 16a. In this case, a mask can be used that does not require tight tolerances or fine alignment, since the central region in which the source/drain regions 16a are formed will be etched away in a later step. Thus, the general mask which is used to delineate between N-channel and P-channel transistors, or making an N-well or P-well type implant, may be used.

FIG. 8 illustrates the mask 20 for forming the trench isolation region 18 after the formation of the transistor structure 12. This mask 20 is selected to form the trench isolation region 18 at a location to separate the two transistors 12 from each other to prevent any undesirable latch up, cross talk, or other destructive interaction. As the trench 18 is formed, some portion of the previously doped region 16a will be removed so that the proper spacing between the source/drain regions of adjacent transistors is maintained based on the mask opening used in the formation of photoresist 20.

The depth of the trench isolation region 18 is selected to achieve a number of desired properties in the final semiconductor product. The depth is selected to provide sufficient electrical isolation between adjacent source/drain regions 16a of adjacent transistors. In addition, the depth is selected to place the strain-inducing layer 24 to be later deposited therein at a selected depth with respect to the source/drain regions 16 and the channel regions 14. Silicon nitride also has an advantage of being more impervious to the spread of dopants, which helps to insulate the trench isolation region 18. Accordingly, the depth of isolation trench region 18 is selected based on the type of strain-inducing layer 24 to be deposited therein, the preferred depth for providing isolation between transistors on either side thereof, the thickness of the strain-inducing layer 24 to be deposited therein and the relative depth of the strain-inducing layer 24 after being deposited therein to the depth of the channel regions 14.

FIG. 9 shows one embodiment of the depth of the trench region 18 as compared to the strain-inducing layer 24. In this embodiment, the top surface of the strain-inducing layer 24 is selected to be approximately parallel to and at the same depth as the channel regions 14. It is therefore just slightly below the top surface of the substrate 10. Alternatively, the top layer may also be aligned with the bottom region of the source/drain region 16. By aligning the main horizontal layer of the strain-inducing layer 24 at the same depth as the source/drain regions and generally at the same depth of the channel regions 14, the strain formed in the layer 24 is applied more directly and specifically to those regions of the substrate 10 in which the mobility of carriers is enhanced by the stress, whether compressive or tensile, which is applied by the strain-inducing layer 24.

After the removal of the photoresist 20, the strain-inducing layer 24 is deposited in the manner previously described with respect to FIG. 5.

In an embodiment of the present invention, the strain-inducing layer may be formed after the gate electrode is formed and before the pre-metal dielectric (PMD) is formed.

Figure 10:
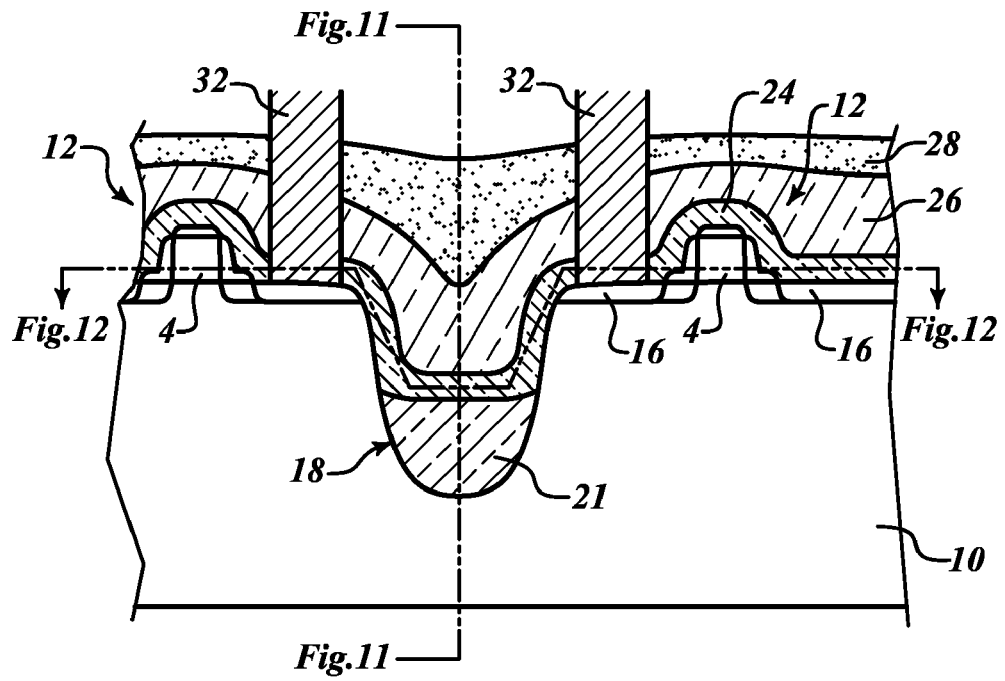
FIG. 10 is a cross-sectional view of a semiconductor device structure according to another embodiment of the present invention.
Figure 11:
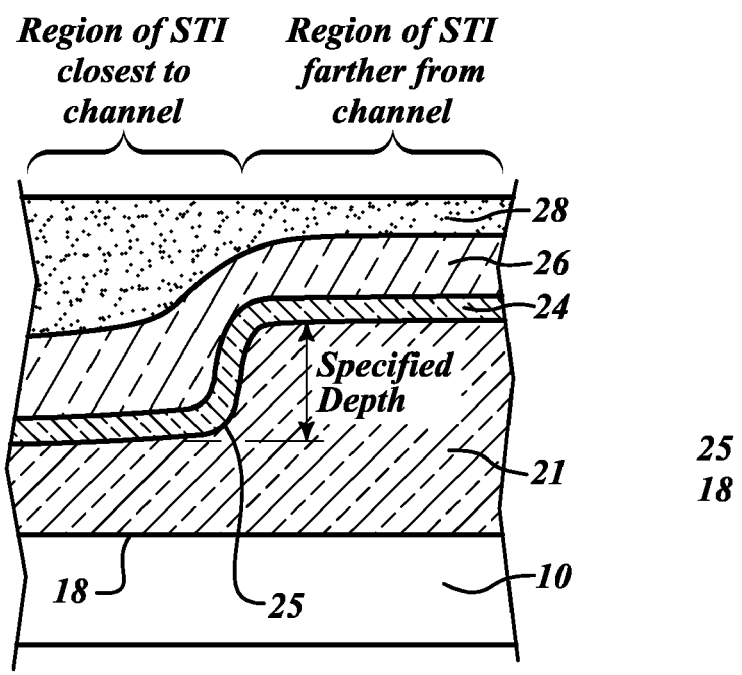
FIG. 11 is a cross-sectional view of the semiconductor device structure shown in FIG. 10, taken along line 11-11, orthogonal to the cross-section of FIG. 10.

Another embodiment of the present invention is illustrated in FIGS. 10 and 11. FIG. 10 shows a cross-sectional view through a completed structure up to the first metallization level according to the alternative embodiment. FIG. 11 shows another cross-sectional view through the same structure shown in FIG. 10, but taken along lines 11-11 of FIG. 10 and thus showing a plane perpendicular to that of FIG. 10.

Figure 12:
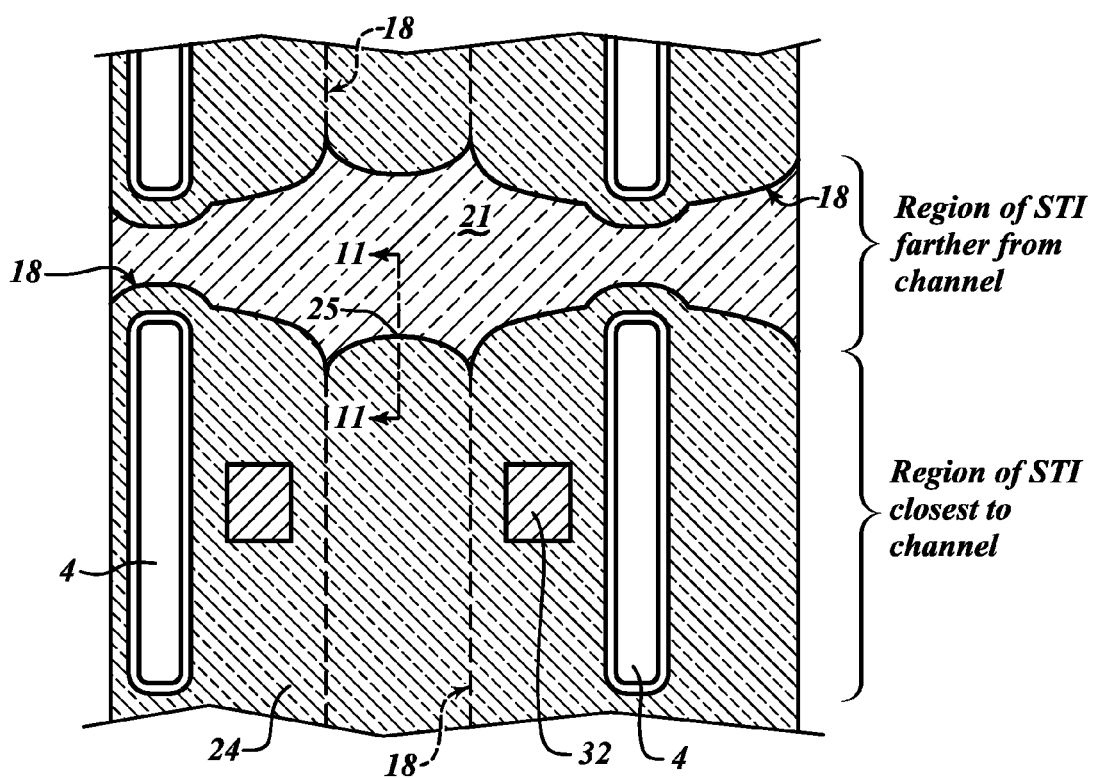
FIG. 12 is a top cross-sectional view taken along line 12-12 in from FIG. 10

In the embodiment of FIGS. 10-12 the trench isolation region 18 has a dielectric isolation material 21 in a bottom portion thereof. The strain-inducing layer 24 is deposited overlying the shallow trench dielectric isolation material 21.

As previously mentioned, the isolation trench 18 has a number of purposes, one of them being to electrically isolate transistors on either side thereof. Depending on the type of transistor, the depth of the isolation trench 18 may be required to be much deeper than the source/drain regions of the transistors in order to prevent parasitic effects, body leakage, or unwanted cross-talk between the transistors. Accordingly, the depth of the isolation trench 18 is selected to provide the appropriate dielectric isolation properties. On the other hand, it is desired to have the strain-inducing layer 24 at a more shallow depth with respect to the source/drain regions 16 and the channel region 14. Accordingly, in the embodiment of FIGS. 10 and 11, the isolation trench region 18 is formed at a desired depth in the trench 18 having the dielectric isolation material 21 in a bottom region therein. The dielectric isolation material 21 is provided at a desired height within the trench region 18 on top of which the strain-inducing layer 24 is formed.

The selected height of the dielectric isolation material 21 can be obtained by a number of acceptable techniques. In the embodiment of FIGS. 2-5, when the etching is carried out, as illustrated in FIG. 4, a portion of the material 21 remains in the bottom of the trench 18 that is not etched. The etch depth is selected to leave the desired height of the dielectric isolation material 21 in the bottom of the trench. In the embodiment of FIGS. 7-9 the trench 18 is etched to a desired depth to achieve the appropriate electrical isolation properties. The shallow trench isolation material 21 is thereafter grown or deposited into the trench 18 to the desired height. After this, the strain-inducing layer 24 is deposited in a blanket fashion over the transistors 12, along the sidewalls of the trench 18, and on top of the dielectric isolation material 21 which has been previously deposited. Other techniques may also be used in order to place the strain-inducing layer 24 at the desired depth in the shallow trench region 18.

As shown in FIG. 11, the profile inside the trench 18 is also selected to place the straining layer at a desired location and depth relative to the channel region. The trench 18 extends at a constant depth for its length. The depth of the strain-inducing layer 24 and the height of the dielectric material 21 is constant for the entire trench in a first embodiment. In a second embodiment, as shown in FIG. 11, the depth of the strain-inducing layer 24 may vary, depending on its location relative to the channel 4.

In the embodiment shown in FIG. 11, at least part of the strain-inducing layer 24 may be formed in the trench 18 in a region of the STI material 21 closest to a gate channel, while other regions of isolation trench 18 do not have the strain-inducing layer 24 within the isolation trench 18 in the same manner, as illustrated in FIGS. 10-12. For example, in an embodiment where the strain-inducing layer 24 is formed in the trench 18 after the dielectric isolation material 21 has already filled the isolation trench regions 18, the patterned mask for removing the dielectric material 21 to allow for formation of the strain-inducing layer within trench 18 at a location below upper most substrate surface may be patterned such that there are regions of dielectric isolation material 21 farther from the gate channels 14 of transistors 12 in which the original dielectric isolation material 21 is not removed. At a transition region 25, the strain-inducing layer 24 rising, towards coming out of the trench and the dielectric isolation material 21 becomes higher, to more completely fill the trench. Hence in these other regions the strain-inducing layer 24 is not formed within isolation trench 18 at a location below upper most substrate surface.

FIG. 12 shows a top view with a cross-section taken along line 12-12 of FIG. 10. This view shows the gate electrodes 4. It can be seen that the trench 18 that extends in the same direction and generally parallel the gate electrodes 4. The strain-inducing layer 24 is shown between the gate electrodes at the specified depth below the silicon substrate in the region of the channel of the transistors 12, but spaced from the channel, the dielectric material is at this depth and the strain-inducing layer is at the top surface of the substrate. The cross-section line 12-12 is not horizontally flat, but is taken as shown in FIG. 10, with a portion at the level of the gate electrodes 4 and a portion at the specified depth of FIG. 11, in the mid-portion of the trench 18. FIG. 12 thus shows more of the strain-inducing layer 24 than would be shown in a flat horizontal cross-section. FIG. 12 illustrates that in the trench 18 the region adjacent the gate electrodes and hence the channel region under the gate electrodes, the strain-inducing layer 24 is present, but in the region of the trench 18 spaced from the channel, such as at the ends of the gate electrodes, the trench dielectric material 21 is present at this same depth. At region 25, shown on both FIGS. 11 and 12, the strain-inducing layer 24 slopes upward, to rise out of the trench. Accordingly, the depth profile and the transition to different depths of the strain-inducing layer 24 can be custom selected in order to direct the desired strain toward the channel regions in which carrier mobility can be most affected by the strain-inducing layer 24. Thus, a large bulk of the strain-inducing layer 24, such as a sloping sidewall and an extended horizontal portion, can be positioned to directly affect the channel region 14 and the source/drain regions 16 by selecting a profile based on the shape and location of the transistor conductive regions 14, 16. In regions farther from the channel, the strain-inducing layer 24 is on the substrate upper surface and, thus, has a different affect on the stress in the surrounding silicon and the substrate 10.

In an embodiment of the present invention, only part of the original insulating material 21 in the isolation trench 18 may be removed prior to forming the strain-inducing layer 24. Again, this is illustrated in FIGS. 10 and 11 where only part of the original insulating material 21 in the isolation trench is removed for the formation of the strain-inducing layer 24. Hence, in the embodiment shown in FIGS. 10 and 11, only part of the dielectric isolation material 21 in the trench region 18 has been removed down to a specified etch depth. For example, the specified etch depth in an embodiment may be (i) greater than 20 nm, (ii) greater than 50 nm, (iii) greater than 100 nm, or (iv) greater than 200 nm. Since the main portion of interest for exerting strain is the channel 14, which is at and just below the upper surface of the substrate, it is preferred in one embodiment to have the strain-inducing layer 24 formed at a specified shallow depth relative to the overall depth of the channel 14 and the source/drain regions 16.

In one embodiment, the depth of the strain-inducing layer 24 is selected to have its bottom most region approximately at the same depth and parallel to the bottom region of the source/drain region 16. In an alternative embodiment, particularly in which LDD implants are used and a very shallow channel region is present during transistor operation, the depth of the strain-inducing layer 24 will be approximately the depth of its own thickness. Namely, the depth D will be approximately equal to the height H of the strain-inducing layer 24 and the top edge of the strain-inducing layer 24 which is within the trench 18 will be approximately planar with the upper surface of the substrate 10. The strain exerted by the strain-inducing layer 24 will, therefore, be directed from the surface of the substrate to a depth approximately corresponding to its own thickness as deposited within the substrate.

As previously mentioned, the strain-inducing layer 24 may be a laminate of two or more layers of various materials including different silicon nitride layers deposited under different conditions, or alternating silicon nitride and silicon dioxide layers or other layers. In such embodiments in which a laminated strain-inducing layer 24 is used, the stress induced by each layer in the laminate can be selected to have a desired amount based on its depth within the silicon substrate 10. The layer having moderate strain-inducing properties may be deposited first on top which is a layer with greater strain-inducing properties. In one embodiment, the layer having the greatest strain-inducing properties will be deposited near the region planar with the substrate in order to have more direct effect on the carrier mobility within the channel 14 and the source/drain region 16. In an alternative embodiment, the primary source of the strain on the channel 14 from the strain-inducing layer 24 may come through the sidewall regions formed adjacent the gate electrode and through the gate electrode itself based on the strain-inducing layer 24 being overlaid on the sidewall spacers and over a top surface of the gate electrode. In such instances, the initial layer in the multilayer laminate 24 may have the highest strain so as to directly apply strain via the sidewall oxides and gate electrode to the channel region 14.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of forming a plurality of strained silicon transistors comprising:
    forming a trench in a substrate, the trench having sidewalls and a bottom located in the substrate;
    forming a dielectric layer over the substrate;
    forming a conductive gate electrode layer over the dielectric layer;
    etching the conductive gate electrode layer and the dielectric layer to form a first gate electrode and a second gate electrode overlying the substrate, the trench being positioned between the first and second gate electrodes and being spaced a selected distance from the first and second gate electrodes;
    implanting dopants into the substrate at a locations between the first and second gate electrodes to form a source/drain regions for the first and second transistors;
    depositing a compressive stress inducing dielectric layer overlying the first and second gate electrodes, the source/drain regions, the sidewalls and the bottom of the trench in the substrate;
    filling the trench with a dielectric material prior to forming the compressive stress inducing dielectric layer over the substrate; and
    etching all of the dielectric material out of the trench after implanting dopants into the substrate to form source and drain regions and prior to depositing the compressive stress inducing dielectric layer overlying the first and second gate electrodes.

2. The method according to claim 1 wherein the forming of the trench in the substrate is performed after etching the conductive gate electrode layer and forming the first and second gate electrodes and after implanting dopants into the substrate at locations between the first and second gate electrodes, the location of the trench being positioned between the first and second gate electrodes; and
    removing at least some of the implanted dopants when the trench is formed.

3. The method according to claim 1 further comprising:
    forming a low-k, nanoporous dielectric material overlying the compressive stress inducing dielectric layer, the first and second gate electrodes, the source/drain regions, the sidewalls and filling the remainder of the trench in the substrate that is not previously filled, the low-k dielectric layer extending from inside the trench to outside the trench.

4. A method of forming a strained silicon transistor comprising:
    forming a gate dielectric layer over a semiconductor substrate;
    forming first and second conductive gate electrodes over the gate dielectric layer;

implanting dopants into the semiconductor substrate at a location between the first and second gate electrodes to form respective source/drain regions for two transistors having respective channel regions in the substrate, under the gate electrode;

etching the semiconductor substrate to form a trench having sidewalls and a bottom that is below the channel region, the trench being positioned between the first and second gate electrodes and the etching to form the trench taking place after forming the gate electrodes; and depositing a stress inducing dielectric layer over the gate electrodes and into the trench, said stress inducing layer-extending as one contiguous layer overlying the first and second gate electrodes as well as the sidewalls and the bottom of the trench.

5. The method according to claim 4 further including:

depositing a trench dielectric material into the trench to partially fill the trench prior to depositing the stress inducing dielectric layer into the trench; and depositing the stress inducing dielectric layer on top of the trench dielectric material in the trench.

6. The method according to claim 4 wherein the bottom of the trench is the semiconductor substrate.

7. The method according to claim 4 wherein the depth of the trench is approximately equal to the thickness of the stress inducing dielectric layer that is going to be deposited into the trench.

8. The method of claim 4 further including depositing a low-k, nanoporous pre-metal dielectric material overlying the stress inducing dielectric layer and being positioned at least partially within the trench.

9. The method of claim 4 wherein the stress inducing dielectric layer induces compressive stress in the channel region.

10. The method of claim 4 wherein the stress inducing dielectric layer induces tensile stress in the channel region.

11. The method of claim 4 wherein the trench extends parallel to the longitudinal plane of the gate electrode and is longer than the gate electrode.

12. The method of claim 11 wherein the portion of the trench that is most adjacent the gate electrode has the stress inducing dielectric layer positioned therein and the portion of the trench that is spaced farther from gate electrode extends parallel to the longitudinal plane of the gate electrode and is longer than the gate electrode.

13. A semiconductor structure comprising:

a semiconductor substrate;

a first transistor channel region in the substrate;

a second transistor channel region in the substrate;

transistor gate electrodes overlying the respective first and second transistor channel regions;

a first source/drain region positioned in the substrate adjacent the first transistor channel region;

a second source/drain region positioned in the substrate adjacent the second transistor channel region;

a trench isolation region positioned in the substrate adjacent to and between the first and second source/drain regions of the transistors, the trench isolation region having sidewalls within the semiconductor substrate and electrically insulating the first and second source/drain regions from each other;

a contiguous dielectric adhesion layer lining the bottom and sidewalls of the trench within the trench isolation region; and a first contiguous dielectric layer having compressive stress positioned overlying each of the transistor gate electrodes, each of the source/drain regions, and being in direct contact with the contiguous dielectric adhesion layer on the sidewalls and bottom of the trench isolation region, the contiguous adhesion layer being between the first dielectric layer and the sidewalls of the trench.

* * * * *

UNITED STATES PATENT AND TRADEMARK OFFICE
CERTIFICATE OF CORRECTION

PATENT NO. : 8,216,904 B2
APPLICATION NO. : 12/651217
DATED : July 10, 2012
INVENTOR(S) : Barry Dove It is certified that error appears in the above-identified patent and that said Letters Patent is hereby corrected as shown below:

On the Title Page

Item (73):
"ST Microelectronics, Inc., Carrollton, TX (US)" should read, --STMicroelectronics, Inc., Carrollton, TX (US)--.

Signed and Sealed this
Twenty-second Day of October, 2013

Teresa Stanek Rea
*Deputy Director of the United States Patent and Trademark Office*